United States Patent
Hurley et al.

(10) Patent No.: US 7,733,992 B2
(45) Date of Patent: Jun. 8, 2010

(54) METHOD AND SYSTEM FOR PROVIDING ANALOG CONTROL OF DIGITAL GAIN IN A WIRELESS DEVICE

(75) Inventors: William M. Hurley, Murphy, TX (US); Yoonyoung Park, Dallas, TX (US)

(73) Assignee: Samsung Electronics Co., Ltd., Suwon-si (KR)

( * ) Notice: Subject to any disclaimer, the term of this patent is extended or adjusted under 35 U.S.C. 154(b) by 759 days.

(21) Appl. No.: 11/639,662

(22) Filed: Dec. 15, 2006

(65) Prior Publication Data

US 2008/0144748 A1    Jun. 19, 2008

(51) Int. Cl.
*H04L 27/08* (2006.01)
(52) U.S. Cl. ...................................................... 375/345
(58) Field of Classification Search ................ 375/259, 375/316, 324, 345; 379/387.02; 324/607; 341/126, 127, 128, 155, 156, 159; 455/127.2, 455/136, 138, 232.1; 327/309
See application file for complete search history.

(56) References Cited

U.S. PATENT DOCUMENTS

| 7,477,710 B2 * | 1/2009 | Narayan et al. ............. 375/349 |
| 2007/0001880 A1 * | 1/2007 | Gierenz et al. .............. 341/118 |

* cited by examiner

*Primary Examiner*—Sam K Ahn (57) ABSTRACT

A method for providing analog control of digital gain in a wireless device is provided. The method includes receiving an analog gain from a baseband modem at a radio frequency integrated circuit (RFIC) having a digital region. The baseband modem is associated with a first operating range, and the digital region of the RFIC is associated with a second operating range. The analog gain is compatible with the first operating range. A digital gain is generated based on the analog gain. The digital gain is converted into a modified digital gain compatible with the second operating range.

26 Claims, 7 Drawing Sheets

METHOD AND SYSTEM FOR PROVIDING ANALOG CONTROL OF DIGITAL GAIN IN A WIRELESS DEVICE

TECHNICAL FIELD OF THE INVENTION

The present application relates generally to integrated circuits and, more specifically, to a method and system for providing analog control of digital gain in a wireless device.

BACKGROUND OF THE INVENTION

As digital processing technologies in the wireless industry have advanced recently, digital logic has focused more on the receive and transmit chains of the wireless radio frequency integrated circuit (RFIC). In addition, the number of baseband modems available continues to increase and each of these has different specifications. Further, internal control of current RFIC receive and transmit gain is typically digital. Thus, the interface between the wireless terminal and the baseband modems has become more complicated, and development of RFICs is delayed by the additional step of matching analog parameters in the baseband modem with digital parameters in the RFIC.

A number of baseband modems use analog control of gain, and the voltage range on the gain pin of the RFIC is generally different from that of the baseband modems. Furthermore, the voltage range and the gain range of each baseband modem may vary. Thus, a variety of interface specifications must be supported to allow for multiple baseband modems to operate with a single RFIC. However, adapting analog control of gain to digital control typically requires significant software development for each target baseband modem. In addition, rewriting software to transfer gain via a serial port interface results in critical software impact on the terminal and may not even be possible because gain control is hardware-based for many modems. Therefore, there is a need in the art for an improved method of providing analog control of digital gain in the RFIC.

SUMMARY OF THE INVENTION

A method for providing analog control of digital gain in a wireless device is provided. According to an advantageous embodiment of the present disclosure, the method includes receiving an analog gain from a baseband modem at a radio frequency integrated circuit (RFIC) having a digital region. The baseband modem is associated with a first operating range, and the digital region of the RFIC is associated with a second operating range. The analog gain is compatible with the first operating range. A digital gain is generated based on the analog gain. The digital gain is converted into a modified digital gain compatible with the second operating range.

According to another embodiment of the present disclosure, a gain control converter for an integrated circuit is provided that includes a slope corrector, an offset applier and a limiter. The slope corrector is operable to receive a digital gain associated with a first operating range and to apply a slope-correction factor to the digital gain to generate a slope-corrected signal. The offset applier is coupled to the slope corrector and is operable to receive the slope-corrected signal and to apply an offset to generate an offset signal. The limiter is coupled to the offset applier. The limiter is operable to receive the offset signal and to generate a modified digital gain based on the offset signal and a set of predefined limits. The modified digital gain is associated with a second operating range.

According to yet another embodiment of the present disclosure, an integrated circuit is provided that includes an analog-to-digital converter (ADC) and a gain control converter. The ADC is coupled to a baseband modem that is associated with a first operating range. The ADC is operable to receive an analog gain compatible with the first operating range from the baseband modem and to generate a digital gain based on the analog gain. The gain control converter is coupled to the ADC. The gain control converter is operable to receive the digital gain from the ADC and to generate a modified digital gain based on the digital gain. The modified digital gain is compatible with a second operating range that is associated with a digital region of the integrated circuit.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or" is inclusive, meaning and/or; the term "each" means every one of at least a subset of the identified items; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION OF THE INVENTION

FIGS. 1 through 6, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged integrated circuit.

Figure 1:
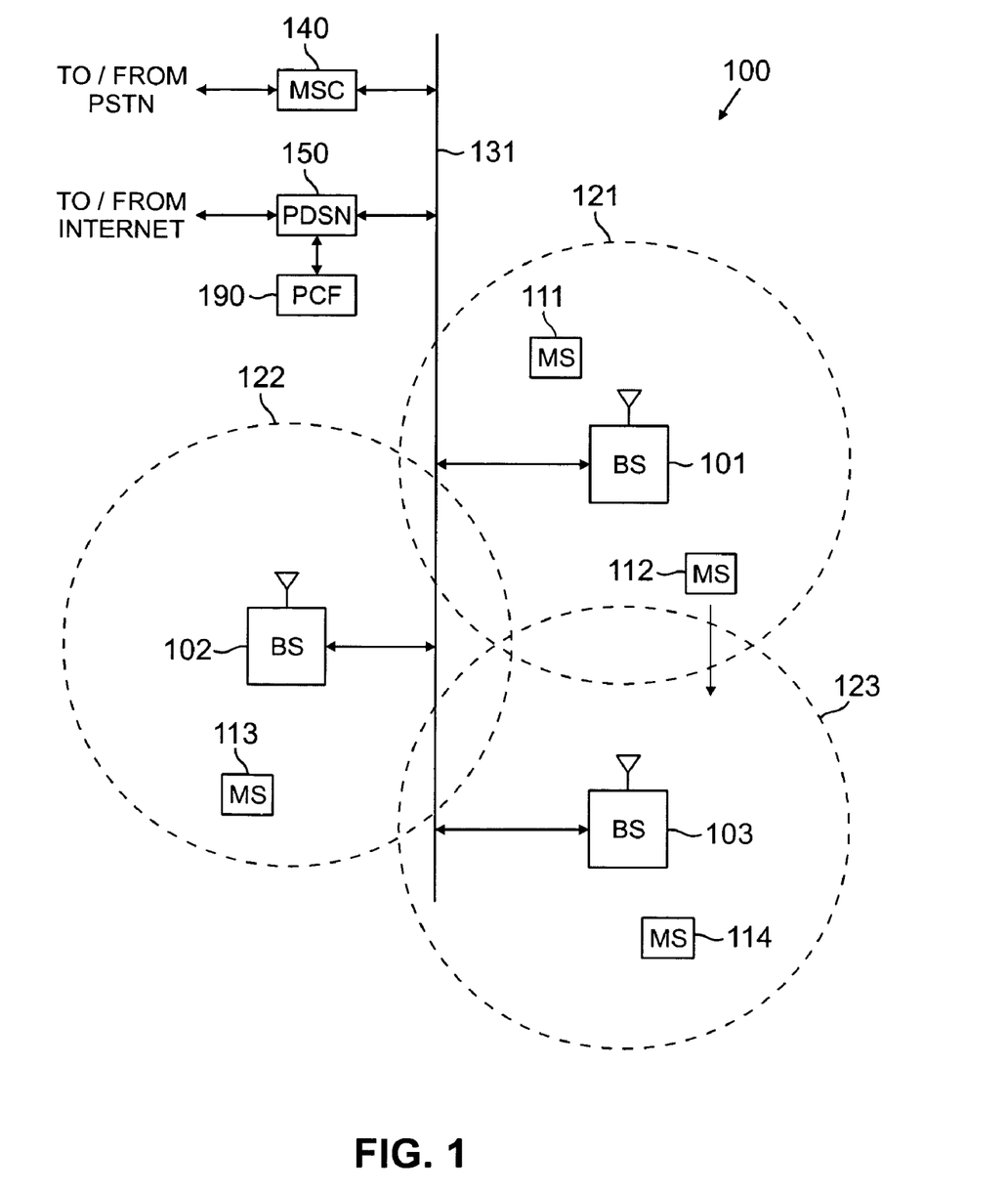
FIG. 1 illustrates a wireless network including wireless devices capable of providing analog control of digital gain according to one embodiment of the disclosure.

FIG. 1 illustrates a wireless network 100 including wireless devices capable of providing analog control of digital gain according to one embodiment of the disclosure. Wireless network 100 comprises a plurality of cells (or cell sites) 121-123, each containing one of the base stations, BS 101, BS 102, or BS 103. Base stations 101-103 communicate with a plurality of mobile stations (MS) 111-114 over code division multiple access (CDMA) channels according to, for example, the IS-2000 standard (i.e., CDMA2000). In an advantageous embodiment of the present disclosure, mobile stations 111-114 are capable of receiving data traffic and/or voice traffic on two or more CDMA channels simultaneously. Mobile stations 111-114 may be any suitable wireless devices (e.g., conventional cell phones, PCS handsets, personal digital assistant (PDA) handsets, portable computers, telemetry devices) that are capable of communicating with base stations 101-103 via wireless links.

The present disclosure is not limited to mobile devices. The present disclosure also encompasses other types of wireless access terminals, including fixed wireless terminals. For the sake of simplicity, only mobile stations are shown and discussed hereafter. However, it should be understood that the use of the term "mobile station" in the claims and in the description below is intended to encompass both truly mobile devices (e.g., cell phones, wireless laptops) and stationary wireless terminals (e.g., a machine monitor with wireless capability).

Dotted lines show the approximate boundaries of cells (or cell sites) 121-123 in which base stations 101-103 are located. It is noted that the terms "cells" and "cell sites" may be used interchangeably in common practice. For simplicity, the term "cell" will be used hereafter. The cells are shown approximately circular for the purposes of illustration and explanation only. It should be clearly understood that the cells may have other irregular shapes, depending on the cell configuration selected and variations in the radio environment associated with natural and man-made obstructions.

As is well known in the art, each of cells 121-123 is comprised of a plurality of sectors, where a directional antenna coupled to the base station illuminates each sector. The embodiment of FIG. 1 illustrates the base station in the center of the cell. Alternate embodiments may position the directional antennas in corners of the sectors. The system of the present disclosure is not limited to any particular cell configuration.

In one embodiment of the present disclosure, each of BS 101, BS 102 and BS 103 comprises a base station controller (BSC) and one or more base transceiver subsystem(s) (BTS). Base station controllers and base transceiver subsystems are well known to those skilled in the art. A base station controller is a device that manages wireless communications resources, including the base transceiver subsystems, for specified cells within a wireless communications network. A base transceiver subsystem comprises the radio frequency (RF) transceivers, antennas, and other electrical equipment located in each cell. This equipment may include air conditioning units, heating units, electrical supplies, telephone line interfaces and RF transmitters and RF receivers. For the purpose of simplicity and clarity in explaining the operation of the present disclosure, the base transceiver subsystems in each of cells 121, 122 and 123 and the base station controller associated with each base transceiver subsystem are collectively represented by BS 101, BS 102 and BS 103, respectively.

BS 101, BS 102 and BS 103 transfer voice and data signals between each other and the public switched telephone network (PSTN) (not shown) via communication line 131 and mobile switching center (MSC) 140. BS 101, BS 102 and BS 103 also transfer data signals, such as packet data, with the Internet (not shown) via communication line 131 and packet data server node (PDSN) 150. Packet control function (PCF) unit 190 controls the flow of data packets between base stations 101-103 and PDSN 150. PCF unit 190 may be implemented as part of PDSN 150, as part of MSC 140, or as a stand-alone device that communicates with PDSN 150, as shown in FIG. 1. Line 131 also provides the connection path for control signals transmitted between MSC 140 and BS 101, BS 102 and BS 103 that establish connections for voice and data circuits between MSC 140 and BS 101, BS 102 and BS 103.

Communication line 131 may be any suitable connection means, including a T1 line, a T3 line, a fiber optic link, a network packet data backbone connection, or any other type of data connection. Alternatively, communication line 131 may be replaced by a wireless backhaul system, such as microwave transceivers. Communication line 131 links each vocoder in the BSC with switch elements in MSC 140. The connections on communication line 131 may transmit analog voice signals or digital voice signals in pulse code modulated (PCM) format, Internet Protocol (IP) format, asynchronous transfer mode (ATM) format, or the like.

MSC 140 is a switching device that provides services and coordination between the mobile stations in a wireless network and external networks, such as the PSTN or Internet. MSC 140 is well known to those skilled in the art. In some embodiments, communication line 131 may be several different data links where each data link couples one of BS 101, BS 102, or BS 103 to MSC 140.

In exemplary wireless network 100, MS 111 is located in cell 121 and is in communication with BS 101. MS 112 is also located in cell 121 and is in communication with BS 101. MS 113 is located in cell 122 and is in communication with BS 102. MS 114 is located in cell 123 and is in communication with BS 103. MS 112 is also located close to the edge of cell 123 and is moving in the direction of cell site 123, as indicated by the direction arrow proximate MS 112. At some point, as MS 112 moves into cell site 123 and out of cell site 121, a hand-off will occur.

As described in more detail below, one or more of the mobile stations 111-114 and/or base stations 101-103 comprises a radio frequency integrated circuit (RFIC) that is operable to communicate with a variety of baseband modems. The RFIC is operable to receive an analog gain signal compatible with the operating range of the baseband modem and to convert the analog gain signal into a digital gain signal compatible with the operating range of the digital region of the RFIC. As used herein, "operating range" means the gain and voltage range. Thus, the RFIC may be easily adapted to operate with any suitable baseband modem manufactured by any suitable vendor without requiring a change to the gain control software in the RFIC.

Figure 2:
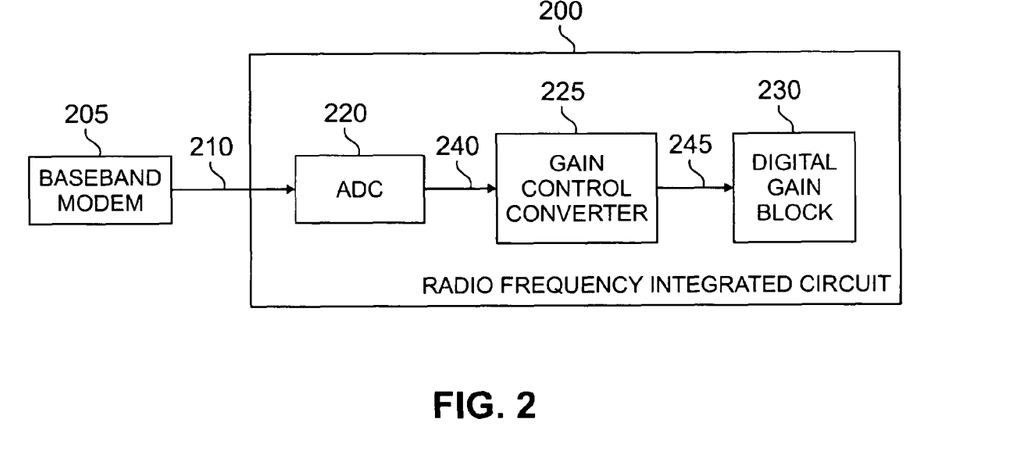
FIG. 2 illustrates an integrated circuit in one of the wireless devices of FIG. 1 that is operable to provide analog control of digital gain according to one embodiment of the disclosure.

FIG. 2 illustrates an integrated circuit 200 that may be implemented in one of the mobile stations 111-114 (or base stations 101-103) and that is operable to provide analog control of digital gain according to one embodiment of the disclosure. The integrated circuit 200, which may comprise an RFIC, is coupled to a baseband modem 205 that is operable to determine an analog gain 210 for the RFIC 200 and to provide the analog gain 210 to the RFIC 200. As described in more detail below, the baseband modem 205 may drive the analog gain 210 within any suitable range of gains at any suitable voltages independent of the operating range of a digital region of the RFIC 200. Thus, the baseband modem 205 is associated with a first operating range, while the digital region of the RFIC 200 is associated with a second operating range.

For the illustrated embodiment, the RFIC 200 comprises an analog-to-digital converter (ADC) 220, a gain control converter 225 and a digital gain block 230. It will be understood that the RFIC 200 comprises additional components not illustrated in FIG. 2.

The ADC 220 is coupled to the baseband modem 205 and is operable to receive the analog gain 210 generated by the baseband modem 205 and to convert the analog gain 210 into a digital gain 240. The gain control converter 225 is coupled to the ADC 220 and is operable to receive the digital gain 240 and to convert the digital gain 240 into a modified digital gain 245. The digital gain block 230 is coupled to the gain control converter 225 and is operable to receive the modified digital gain 245 and to apply a gain to the digital region of the RFIC 200 based on the modified digital gain 245. As described above, the analog gain 210 is compatible with the first operating range and the modified digital gain 245 is compatible with the second operating range.

For one embodiment, the ADC 220 may comprise a relatively low-speed ADC. For a particular embodiment, for example, the ADC 220 may be operable to sample the analog gain 210 at no more than 1 sample/20 µs. In addition, for a particular embodiment, the ADC 220 may comprise a nine-bit ADC. However, it will be understood that the ADC 220 may function at any suitable speed and may comprise any suitable size without departing from the scope of the present disclosure.

The gain control converter 225 is operable to map the digital gains 240 into the valid operating range of the digital region of the RFIC 200 in order to generate the modified digital gains 245 based on those digital gains 240. Thus, for example, if the gain range of the digital gains 240 comprised −20 dB to 100 dB and the gain range of the RFIC 200 comprised −20 dB to 80 dB, the gain control converter 225 would be operable to map the digital gains 240 into modified digital gains 245 in the range of −20 dB to 80 dB. As described in more detail below in connection with FIGS. 5A-C, the gain control converter 225 may be operable to convert digital gains 240 associated with a variety of operating ranges for various types of baseband modems 205.

The digital gain block 230 may be operable to control the digital gain in the digital region of the RFIC 200. Thus, for example, the digital gain block 230 may be operable to partition the modified digital gain 245 and to provide various gains to various digital components of the RFIC 200.

Figure 3:
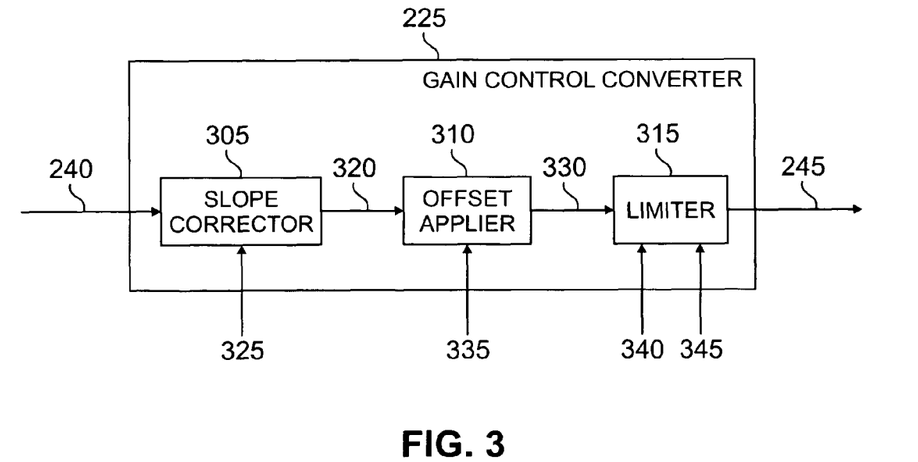
FIG. 3 illustrates the gain control converter of FIG. 2 according to one embodiment of the disclosure.

FIG. 3 illustrates the gain control converter 225 according to one embodiment of the disclosure. The gain control converter 225 comprises a slope corrector 305, an offset applier 310, and a limiter 315. It will be understood that the gain control converter 225 may comprise other suitable components without departing from the scope of this disclosure.

The slope corrector 305 is operable to receive the digital gains 240 from the ADC 220 and to generate a slope-corrected signal 320 based on each digital gain 240. For one embodiment, the slope corrector 305 is operable to generate the slope-corrected signals 320 by multiplying the digital gains 240 by a slope-correction factor 325. In this way, the slope corrector 305 is operable to map the dynamic operating range of the baseband modem 205 to the RFIC 200.

The offset applier 310 is coupled to the slope corrector 305 and is operable to receive the slope-corrected signals 320 and to generate an offset signal 330 based on each slope-corrected signal 320. For one embodiment, the offset applier 310 is operable to generate the offset signals 330 by moving the range of the slope-corrected signals 320 into the same range as the RFIC 200 based on an offset 335.

The limiter 315 is coupled to the offset applier 310 and is operable to receive the offset signals 330 and to generate a limited signal, which corresponds to the modified digital gain 245, based on each offset signal 330. For one embodiment, the limiter 315 is operable to generate the limited signals by ensuring that the modified digital gains 245 remain within the range of the RFIC 200. Thus, when the offset signal 330 is within the range of the RFIC 200, the modified digital gain 245 is essentially equivalent to the offset signal 330. However, when the offset signal 330 is lower than or higher than the valid range of the RFIC 200, the modified digital gain 245 is adjusted by the limiter 315 to a lower limit 340 or an upper limit 345 of that range. As described in more detail below, the limiter 315 may also be operable to truncate the offset signal 330 or the adjusted offset signal 330. For example, for one embodiment, the limiter 315 may be operable to divide the signal 330 by 128.

The slope correction factor 325, the offset 335, the lower limit 340 and/or the upper limit 345 may be provided by any suitable component or through any suitable pin of RFIC 200. For one embodiment, these values 325, 335, 340 and 345 are programmed into the gain control converter 225 based on the baseband modem 205 to be used with the RFIC 200.

Figure 4:
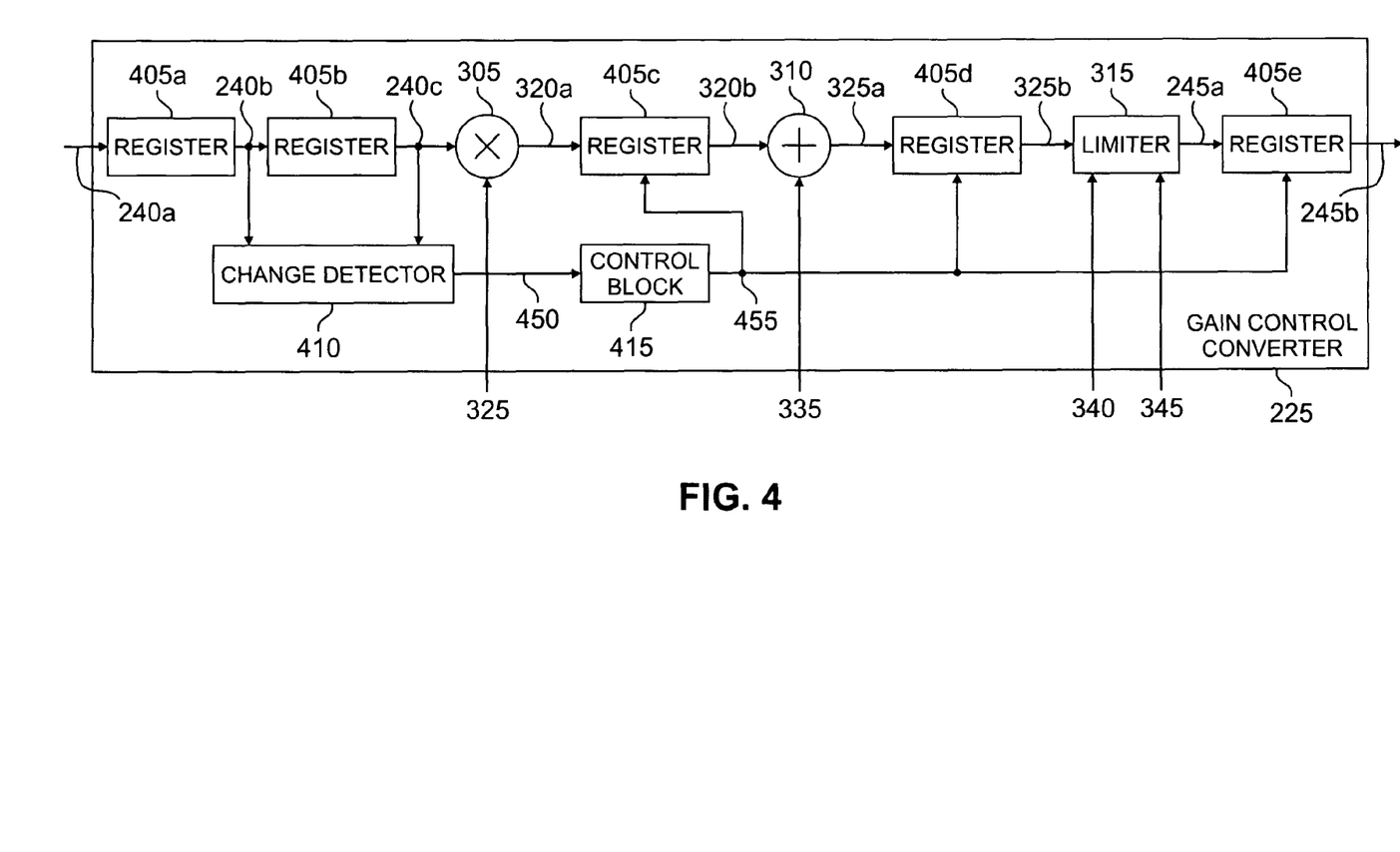
FIG. 4 illustrates the gain control converter of FIG. 3 in greater detail according to one embodiment of the disclosure.

FIG. 4 illustrates the gain control converter 225 in greater detail according to one embodiment of the disclosure. For this embodiment, the gain control converter 225 comprises a plurality of registers 405a-e, a change detector 410 and a control block 415, in addition to the slope corrector 305, offset applier 310 and limiter 315. The slope corrector 305 comprises a multiplier and the offset applier 310 comprises an adder.

Register 405a is operable to receive the digital gain 240a from the ADC 220, to store the digital gain 240 and to provide the digital gain 240b to register 405b. Although labeled as 240a and 240b, it will be understood that the gain 240a received by register 405a is the same as the gain 240b provided as an output on a subsequent cycle. Similarly, the digital gain 240c is the same as 240a after two cycles and the same as 240b after one cycle, the slope-corrected signal 320b is the same as 320a after one cycle, the offset signal 325b is the same as 325a after one cycle, and the modified digital gain 245b is the same as the limited signal 245a after one cycle. Thus, each register 405a-e is operable to receive a signal, store the signal and provide the signal as an output on a subsequent cycle without altering the signal.

Register 405b is coupled to register 405a and is operable to receive the digital gain 240b from register 405a, to store the digital gain 240 and to provide the digital gain 240c to the slope corrector 305. In addition, registers 405a and 405b are coupled to the change detector 410 and are operable to provide the digital gains 240b and 240c to the change detector 410.

The change detector 410 is operable to receive the digital gains 240b and 240c, to compare the gains 240b and 240c to determine whether or not there has been a change from one cycle to the next, and to generate a change signal 450 for the control block 415. The control block 415 is coupled to the change detector 410 and is operable to receive the change signal 450 and to control registers 405c-e based on the change signal 450. If the change signal 450 indicates that a change has occurred, the control block 415 is operable to initiate the calculation of a new modified digital gain 245b by generating a control signal 455 operable to initiate the calculation. If the change signal 450 indicates that no change has occurred, the control block 415 is operable to prompt the gain control converter 225 to continue to output the previously generated modified digital gain 245b by generating a control signal 455 operable to cause the calculation to cease.

The slope corrector 305 is coupled to register 405b and is operable to receive the digital gain 240c and the slope correction factor 325 and to multiply these values 240c and 325 together to generate the slope-corrected signal 320a. Register 405c is coupled to the slope corrector 305 and is operable to receive the slope-corrected signal 320a, to store the signal 320 and to provide the signal 320b to the offset applier 310.

The offset applier 310 is coupled to register 405c and is operable to receive the slope-corrected signal 320b and the offset 335 and to add the offset 335 to the slope-corrected signal 320b to generate the offset signal 325a. Register 405d is coupled to the offset applier 310 and is operable to receive the offset signal 325a, to store the signal 325 and to provide the signal 325b to the limiter 315.

The limiter 315 is coupled to register 405d and is operable to receive the offset signal 325b and the lower and upper limits 340 and 345. The limiter 315 is also operable to adjust the offset signal 325b, if necessary, to keep the signal 325 within the limits 340 and 345 in order to generate the limited signal 245a. The limiter 315 may also be operable to truncate the signal 325, such as by dividing the signal 325 by 128. Register 405e is coupled to the limiter 315 and is operable to receive the limited signal 245a, to store the signal 245 and to output the signal 245b as the modified digital gain 245.

Figure 5A:
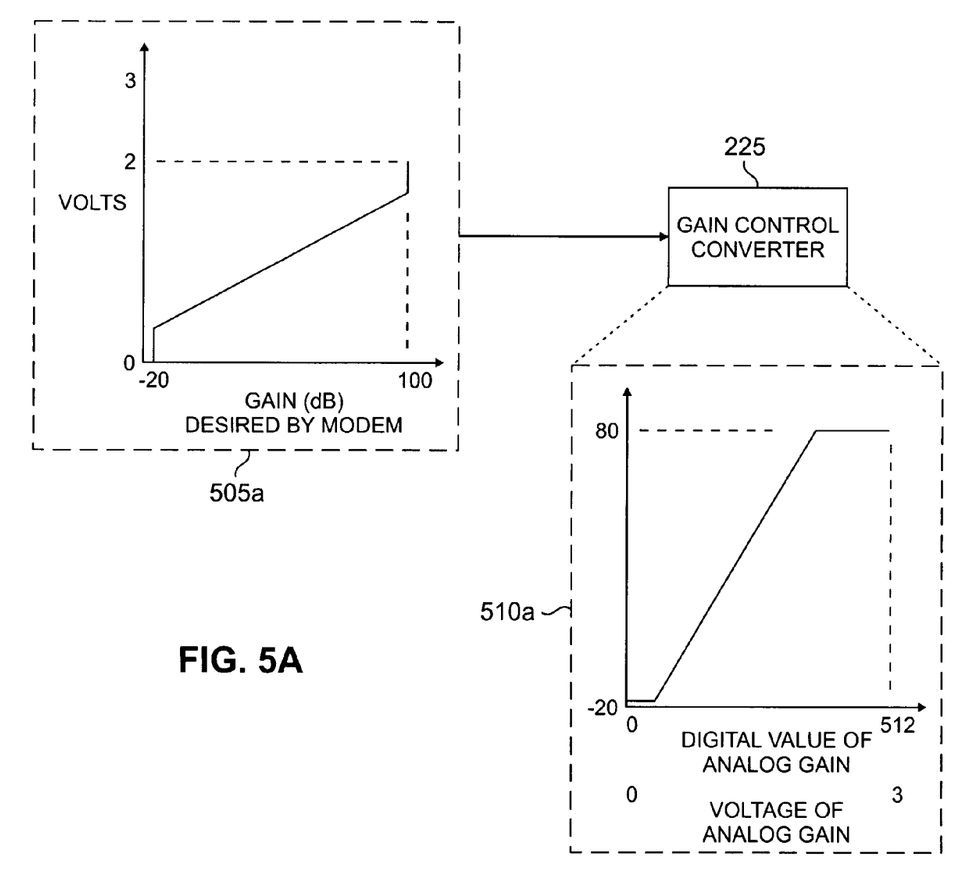
FIGS. 5A-C illustrate graphs of some examples of analog gain control interface specifications for various baseband modems, along with their conversions to digital gain control compatible with the RFIC of FIG. 2 according to one embodiment of the disclosure.
Figure 5B:
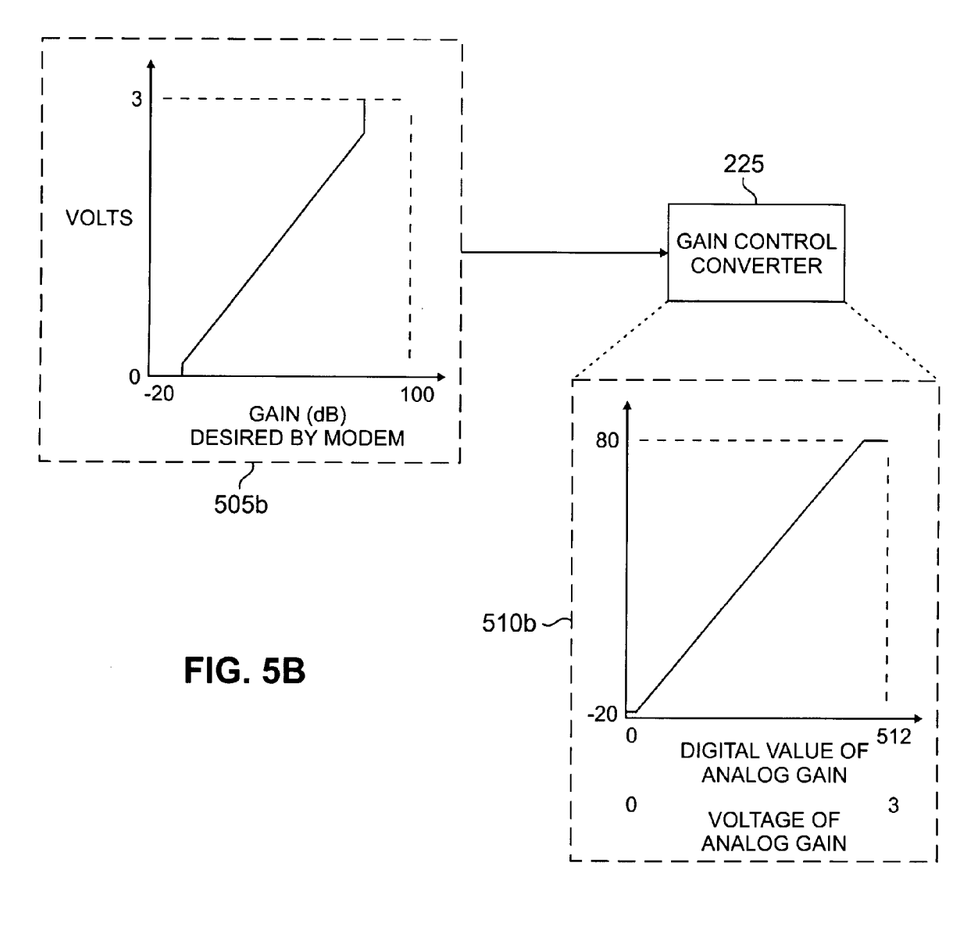
Figure 5C:
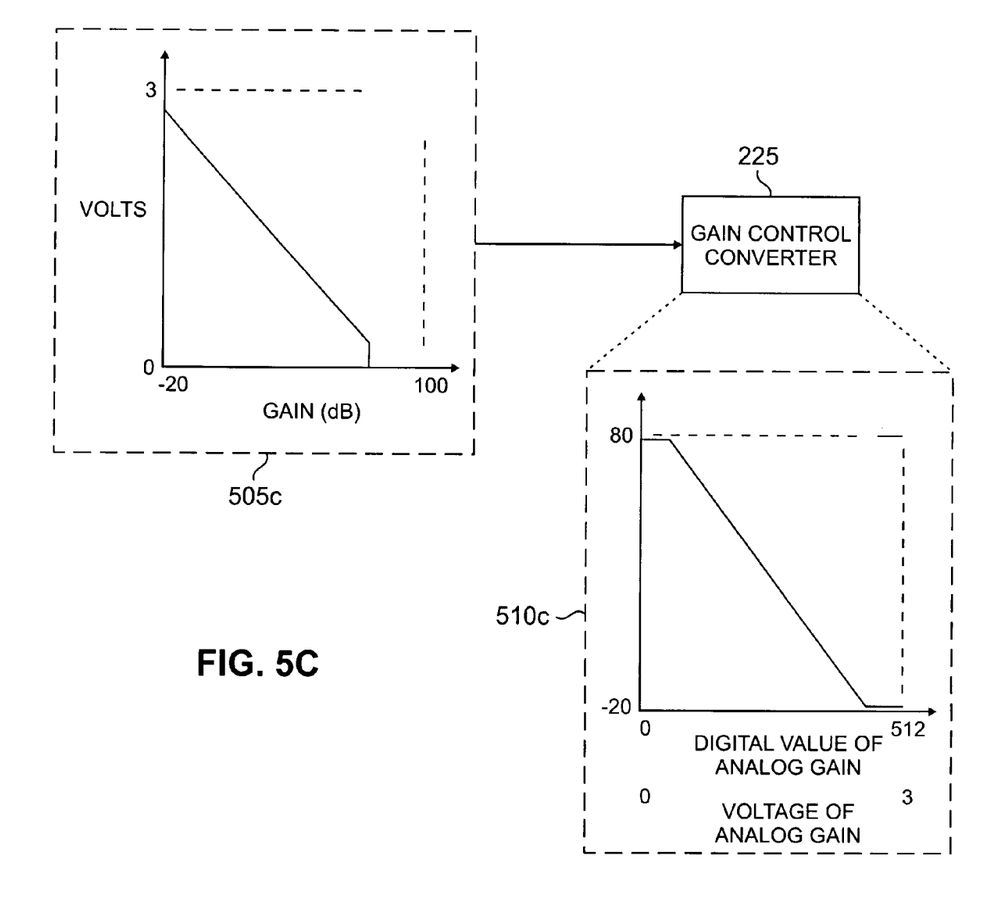

FIGS. 5A-C illustrate graphs of some examples of analog gain control interface specifications 505 for various baseband modems 205, along with the corresponding transfer functions 510 (or translations) performed by the gain control converter 225, according to one embodiment of the disclosure.

In FIG. 5A, the voltage range for the baseband modem 205 is about 0.5 to 1.5 V and the gain range is about −20 dB to 100 dB. In FIG. 5B, the voltage range for the baseband modem 205 is about 0.2 to 2.5 V and the gain range is about −30 dB to 80 dB. In FIG. 5C, the voltage range for the baseband modem 205 is an inverted range of about 2.8 to 0.5 V and the gain range is about −20 dB to 70 dB.

In each of these examples, the conversion provided by the gain control converter 225 results in a voltage range of 0.0 to 3.0 V and a gain range of −20 dB to 80 dB, which corresponds to the operating range of the digital region of the RFIC 200. Thus, the RFIC 200 may communicate with various baseband modems 205 that generate analog gains within a variety of voltage and gain ranges, and the RFIC 200 may convert those analog gains into modified digital gains 245 that may be used by the RFIC 200.

For the particular example illustrated in FIG. 5A, the baseband modem 205 may drive the gain from −20 dB at 0.5 V to 100 dB at 1.5 V, the RFIC 200 may have a valid range of −20 dB to 80 dB, and the ADC 220 may have a full-scale voltage of 3 V. Thus, a 1.0 V range in the baseband modem 205 covering 120 dB is mapped to a 100 dB range in the RFIC 200. For this example, the output (modified digital gain 245) is provided in ½ dB steps and, therefore, the number of possible outputs 245 is twice the total dB range.

The slope correction factor 325 used by the slope corrector 305 for this example may be calculated as follows:

$$S=D*(3/2),$$

where S is the slope correction factor 325 and D is the desired range of dB/V. In addition, the offset 335 may be calculated as follows:

$$\text{Offset}=G_{min}*(128*2)-(V_{in,min}/V_{ref})*511*S,$$

where $G_{min}$ is the minimum digital gain of the RFIC 200, $V_{in,min}$ is the minimum input voltage of the baseband modem 205, and $V_{ref}$ is the voltage range of the RFIC 200. Finally, the lower and upper limits 340 and 345 may be calculated as follows:

$$L_{low}=(128*2)*G_{min}, \text{ and}$$

$$L_{up}=(128*2)*G_{max},$$

where $L_{low}$ is the lower limit 340, $L_{up}$ is the upper limit 345, and $G_{max}$ is the maximum digital gain of the RFIC 200.

Thus, continuing with the example illustrated in FIG. 5A, the values 325, 335, 340 and 345 may be calculated as follows:

$$S=100*(3/2)=150,$$

$$\text{Offset}=(-20*256)-(0.5/3)*511*150=-17,895,$$

$$L\text{low}=256*(-20)=-5120, \text{ and}$$

$$L\text{up}=256*80=20480.$$

For an input digital gain 240 multiplied by the slope correction factor 325 and then added to the offset 335, when the result is divided by 128, an output modified digital gain 245 is provided in ½ dB steps. Thus, as the baseband modem 205 sweeps the analog gain voltage from 0.5 to 1.5 V, the value sampled by the ADC 220 (corresponding to the digital gain 240) will sweep from 85 to 255. The slope-corrected signal 320 will range from 12,750 to 38,250. The offset signal 330 will range from −5,145 to 20,355. Therefore, after being divided by 128 by the limiter 315, the modified digital gain 245 will range from approximately −40 to 160, or −20 dB to 80 dB over the range of 0.5 to 1.5 V, while any excursion below 0.5 V or above 1.5 V is capped by the limiter 315 at the lower limit 340 of −20 dB or the upper limit 345 of 80 dB.

Any or all of the values of the slope correction factor 325, the offset 335, the lower limit 340 and the upper limit 345 may be determined similarly for other variations of the baseband modem 205, such as those illustrated in FIGS. 5B and 5C. In addition, any or all of these values 325, 335, 340 and 345 may be determined in any other suitable manner without departing from the scope of the present disclosure.

Figure 6:
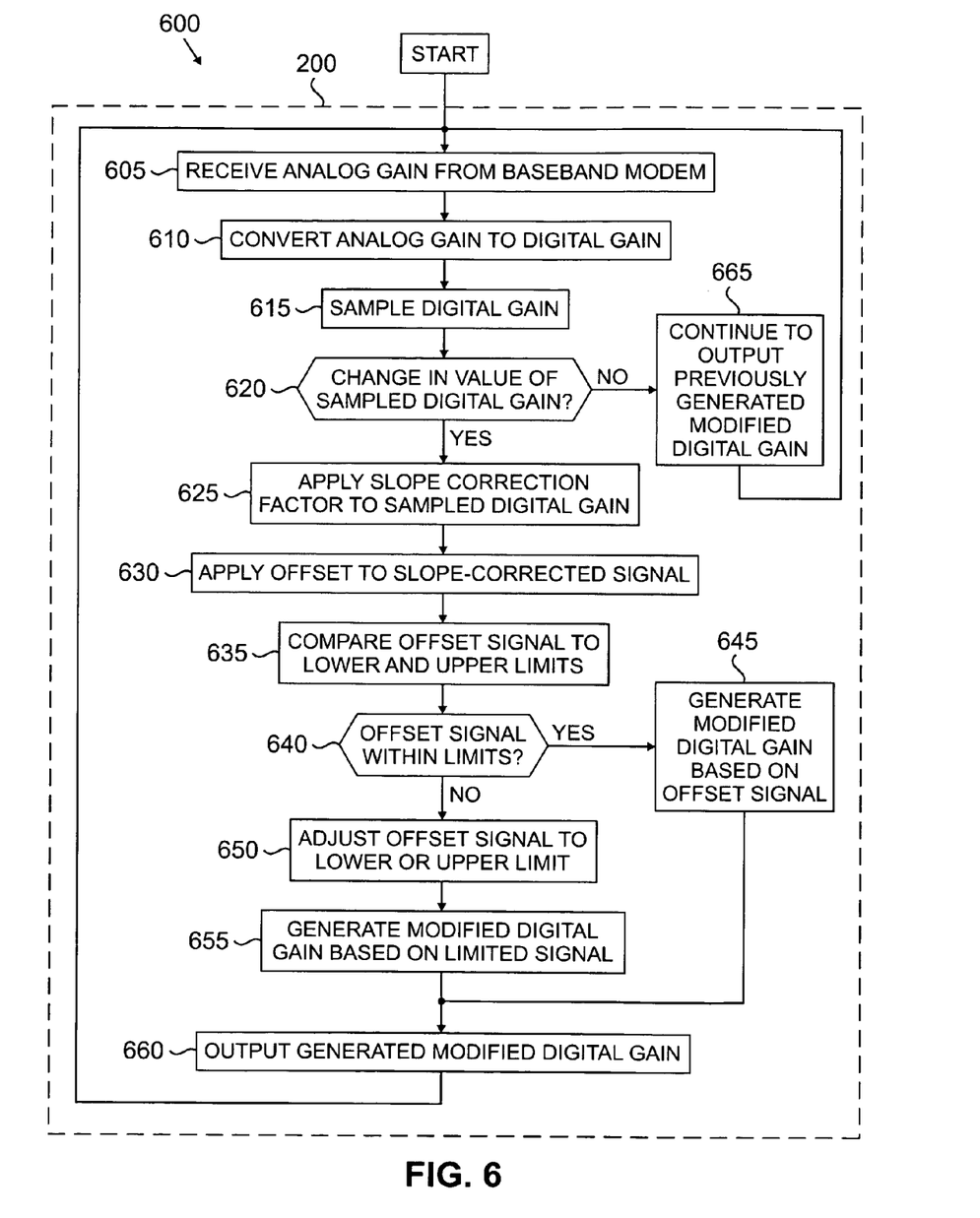
FIG. 6 is a flow diagram illustrating a method for providing analog control of digital gain using the gain control converter of FIG. 2, 3 or 4 according to one embodiment of the disclosure.

FIG. 6 is a flow diagram illustrating a method 600 for providing analog control of digital gain using the gain control converter 225 according to one embodiment of the disclosure. Although described as discrete steps in a particular order, it will be understood that the steps of this method may be performed by the various components of the RFIC 200 based on signals received at each of the components when those signals are received.

Initially, the RFIC 200 receives an analog gain 210 from the baseband modem 205 at the ADC 220 (process step 605). The ADC 220 converts the analog gain 210 into a digital gain 240 (process step 610). The gain control converter 225 then samples the digital gain 240 (process step 615). For example, for one embodiment, registers 405a and 405b may be used to sample the digital gain 240.

The gain control converter 225 determines whether or not there has been a change in the value of the sampled digital gain 240 (process step 620). For example, for one embodiment, the change detector 410 may make this determination based on the digital gains 240b and 240c provided by registers 405a and 405b, respectively.

If there has been a change in the value of the sampled digital gain 240 (process step 620), the calculation of a new modified digital gain 245 is initiated. For example, for the embodiment with the change detector 410 described above, the change detector 410 may generate a change signal 450 for the control block 415 such that the control block 415 initiates a calculation of a new modified digital gain 245 by generating an appropriate control signal 455 for registers 405c-e.

Once the calculation is initiated, the slope corrector 305 applies a slope correction factor 325 to the sampled digital gain 240 (process step 625). For example, for one embodiment, the slope corrector 305 may multiply the digital gain 240 by the slope correction factor 325 to generate a slope-corrected signal 320.

The offset applier 310 then applies an offset 335 to the slope-corrected signal 320 (process step 630). For example, for one embodiment, the offset applier 310 adds the offset 335 to the slope-corrected signal 320 to generate an offset signal 325.

The limiter 315 compares the offset signal 325 to a lower limit 340 and an upper limit 345 (process step 635). If the offset signal 325 is within the limits 340 and 345 (process step 640), the gain control converter 225 generates the modified digital gain 245 based on the offset signal 325 (process step 645). Thus, for this situation, the modified digital gain 245b is essentially the same as the offset signal 325 because the limiter 315 has not adjusted the offset signal 325 in generating a limited signal 245a (with the possible exception of truncating the offset signal 325, such as by dividing the offset signal 325 by 128).

However, if the offset signal 325 is not within the limits 340 and 345 (process step 640), the limiter 315 adjusts the offset signal 325 up to the lower limit 340 or down to the upper limit 345 to generate a limited signal 245a (process step 650). In addition, as previously described, the limiter 315 may truncate the signal 325, such as by dividing the signal 325 by 128, in generating the limited signal 245a. The gain control converter 225 then generates the modified digital gain 245 based on the limited signal 245a (process step 655). Thus, for this situation, the modified digital gain 245b is the same as the limited signal 245a, which has been generated by adjusting the offset signal 325 (and possibly truncating the signal 325).

Whether the modified digital gain 245 has been generated based on the offset signal 325 (process step 645) or based on the limited signal 245a (process step 655), the gain control converter 225 outputs the modified digital gain 245 that has been generated (process step 660).

Returning to decisional step 620, if there has been no change in the value of the sampled digital gain 240, the gain control converter 225 continues to output the modified digital gain 245 that was previously generated based on the same value of the sampled digital gain 240 (process step 665). For the previously described embodiment, in this situation, the change detector 410 may generate the change signal 450 for the control block 415 such that the control block 415 causes the calculation of a modified digital gain 245 to cease by generating an appropriate control signal 455 for registers 405c-e.

In this way, analog gain 210 from any one of a variety of baseband modems 205 may be converted into a modified digital gain 245 within the RFIC 200 for use by the digital gain block 230 of the RFIC 200. Because the RFIC 200 is able to function with various gain controls of different ranges, the RFIC 200 is compatible with a variety of baseband modems 205. Thus, greater flexibility in vendor choice is provided with regard to the baseband modem 205, and only negligible or no changes need to be implemented in gain control software. In addition, the gain control converter 225 is silicon-efficient, using minimal area of the RFIC 200.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. A method for providing analog control of digital gain in a wireless device, comprising:
   receiving an analog gain from a baseband modem at a radio frequency integrated circuit (RFIC) comprising a digital region, the baseband modem associated with a first operating range and the digital region of the RFIC associated with a second operating range, the analog gain compatible with the first operating range;
   generating a digital gain based on the analog gain; and
   converting the digital gain into a modified digital gain compatible with the second operating range, wherein converting the digital gain into the modified digital gain comprises (i) applying a slope-correction factor to the digital gain to generate a slope-corrected signal, and (ii) applying an offset to the slope-corrected signal to generate an offset signal.

2. The method as set forth in claim 1, further comprising:
   sampling the digital gain to generate a sampled digital gain for each of a plurality of cycles.

3. The method as set forth in claim 1, converting the digital gain into the modified digital gain further comprising receiving the slope-correction factor and the offset, the slope-correction factor and the offset calculated based on the first operating range and the second operating range.

4. The method as set forth in claim 1, applying the slope-correction factor to the digital gain comprising multiplying the digital gain by the slope-correction factor.

5. The method as set forth in claim 1, applying the offset to the slope-corrected signal comprising adding the offset to the slope-corrected signal.

6. The method as set forth in claim 1, converting the digital gain into the modified digital gain further comprising:
   determining whether the offset signal is within a set of predefined limits; and
   when the offset signal is within the set of predefined limits, generating the modified digital gain based on the offset signal.

7. The method as set forth in claim 6, converting the digital gain into the modified digital gain further comprising:
   when the offset signal is outside the set of predefined limits, limiting the offset signal based on the predefined limits to generate a limited signal; and
   generating the modified digital gain based on the limited signal.

8. The method as set forth in claim 7, converting the digital gain into the modified digital gain further comprising receiving the slope-correction factor, the offset and the set of predefined limits, the slope-correction factor and the offset calculated based on the first operating range and the second operating range, and the set of predefined limits calculated based on the second operating range.

9. The method as set forth in claim 2, further comprising:
determining whether the sampled digital gain has changed between consecutive cycles; and
when the sampled digital gain has changed between consecutive cycles, initiating the conversion of the digital gain into the modified digital gain.

10. A gain control converter for an integrated circuit, comprising:
a slope corrector operable to receive a digital gain associated with a first operating range and to apply a slope-correction factor to the digital gain to generate a slope-corrected signal;
an offset applier coupled to the slope corrector, the offset applier operable to receive the slope-corrected signal and to apply an offset to generate an offset signal; and
a limiter coupled to the offset applier, the limiter operable to receive the offset signal and to generate a modified digital gain based on the offset signal and a set of predefined limits, the modified digital gain associated with a second operating range.

11. The gain control converter as set forth in claim 10, the first operating range corresponding to a baseband modem coupled to the integrated circuit, and the second operating range corresponding to a digital region of the integrated circuit.

12. The gain control converter as set forth in claim 10, the slope corrector further operable to receive the slope-correction factor and the offset applier further operable to receive the offset, the slope-correction factor and the offset calculated based on the first operating range and the second operating range.

13. The gain control converter as set forth in claim 10, the slope corrector comprising a multiplier operable to generate the slope-corrected signal by multiplying the digital gain by the slope-correction factor.

14. The gain control converter as set forth in claim 10, the offset applier comprising an adder operable to generate the offset signal by adding the offset to the slope-corrected signal.

15. The gain control converter as set forth in claim 10, the limiter operable to generate the modified digital gain based on the offset signal and the set of predefined limits by determining whether the offset signal is within the set of predefined limits and, when the offset signal is within the set of predefined limits, generating the modified digital gain based on the offset signal.

16. The gain control converter as set forth in claim 15, the limiter further operable to generate the modified digital gain based on the offset signal and the set of predefined limits by, when the offset signal is outside the set of predefined limits, limiting the offset signal based on the predefined limits to generate a limited signal and generating the modified digital gain based on the limited signal.

17. The gain control converter as set forth in claim 16, the slope corrector further operable to receive the slope-correction factor, the offset applier further operable to receive the offset and the limiter further operable to receive the set of predefined limits, the slope-correction factor and the offset calculated based on the first operating range and the second operating range, and the set of predefined limits calculated based on the second operating range.

18. The gain control converter as set forth in claim 10, the slope corrector comprising a multiplier and the offset applier comprising an adder, the gain control converter further comprising:

a first register operable to receive the digital gain and to output the digital gain;
a second register coupled to the first register, the second register operable to receive the digital gain from the first register and to output the digital gain;
a change detector coupled to the first register and the second register, the change detector operable to receive the digital gain output by the first and second registers, to detect a change in the digital gain for consecutive cycles based on the digital gain output by the first and second registers and to generate a change signal based on the detection; and
a control block coupled to the change detector, the control block operable to receive the change signal and, based on the change signal, to generate a control signal operable to initiate or to cease the generation of the modified digital gain.

19. The gain control converter as set forth in claim 18, the slope corrector coupled to the second register and operable to receive the digital gain from the second register and the slope-correction factor, the gain control converter further comprising:
a third register coupled to the slope corrector and the control block, the third register operable to receive the slope-corrected signal and the control signal and to output the slope-corrected signal based on the control signal, the offset applier coupled to the third register and operable to receive the slope-corrected signal from the third register and the offset;
a fourth register coupled to the offset applier and the control block, the fourth register operable to receive the offset signal and the control signal and to output the offset signal based on the control signal, the limiter coupled to the fourth register and operable to receive the offset signal from the fourth register and the predefined set of limits; and
a fifth register coupled to the limiter and the control block, the fifth register operable to receive the modified digital gain and the control signal and to output the modified digital gain from the gain control converter based on the control signal.

20. An integrated circuit, comprising:
an analog-to-digital converter (ADC) coupled to a baseband modem associated with a first operating range, the ADC operable to receive an analog gain compatible with the first operating range from the baseband modem and to generate a digital gain based on the analog gain; and
a gain control converter coupled to the ADC, the gain control converter operable to receive the digital gain from the ADC and to generate a modified digital gain based on the digital gain, the modified digital gain compatible with a second operating range associated with a digital region of the integrated circuit, the gain control converter comprising:
a slope corrector operable to receive the digital gain and to apply a slope-correction factor to the digital gain to generate a slope-corrected signal;
an offset applier coupled to the slope corrector, the offset applier operable to receive the slope-corrected signal and to apply an offset to generate an offset signal.

21. The integrated circuit as set forth in claim 20, the gain control converter further comprising:
a limiter coupled to the offset applier, the limiter operable to receive the offset signal and to generate the modified digital gain based on the offset signal and a set of predefined limits.

22. The integrated circuit as set forth in claim 21, the slope corrector comprising a multiplier operable to generate the slope-corrected signal by multiplying the digital gain by the slope-correction factor.

23. The integrated circuit as set forth in claim 21, the offset applier comprising an adder operable to generate the offset signal by adding the offset to the slope-corrected signal.

24. The integrated circuit as set forth in claim 21, the limiter operable to generate the modified digital gain based on the offset signal and the set of predefined limits by determining whether the offset signal is within the set of predefined limits and, when the offset signal is within the set of predefined limits, generating the modified digital gain based on the offset signal.

25. The integrated circuit as set forth in claim 24, the limiter further operable to generate the modified digital gain based on the offset signal and the set of predefined limits by, when the offset signal is outside the set of predefined limits, limiting the offset signal based on the predefined limits to generate a limited signal and generating the modified digital gain based on the limited signal.

26. The integrated circuit as set forth in claim 20, further comprising a digital gain block coupled to the gain control converter, the digital gain block operable to receive the modified digital gain and to apply a gain to the digital region of the integrated circuit based on the modified digital gain.

* * * * *